United States Patent
Xue et al.

(10) Patent No.: US 10,312,208 B2
(45) Date of Patent: Jun. 4, 2019

(54) COPPER PILLAR BUMP STRUCTURE AND MANUFACTURING METHOD THEREFOR

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Xingtao Xue, Shanghai (CN); Chih Ching Ho, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/891,745

(22) Filed: Feb. 8, 2018

(65) Prior Publication Data

US 2018/0254254 A1    Sep. 6, 2018

(30) Foreign Application Priority Data

Mar. 2, 2017  (CN) .......................... 2017 1 0118714

(51) Int. Cl.
*H01L 23/00*    (2006.01)

(52) U.S. Cl.
CPC .............. *H01L 24/11* (2013.01); *H01L 24/05* (2013.01); *H01L 24/13* (2013.01); *H01L 24/03* (2013.01);
(Continued)

(58) Field of Classification Search
None
See application file for complete search history.

(56) References Cited

U.S. PATENT DOCUMENTS

| 6,426,281 | B1 * | 7/2002 | Lin .......................... H01L 24/11 257/E21.508 |
| 2003/0134496 | A1 * | 7/2003 | Lee ...................... H01L 23/3114 438/612 |

(Continued)

OTHER PUBLICATIONS

Koh, Wei, et. al., "Copper Pillar Bump Technology Progress Overview", 2011 12th International Conference on Electronic Packaging Technology and High Density Packaging, 2011, doi:10.1109/icept.2011.6067027.*

(Continued)

*Primary Examiner* — J. E. Schoenholtz
(74) *Attorney, Agent, or Firm* — Kilpatrick Townsend & Stockton LLP (57) ABSTRACT

A method for manufacturing a metal bump device includes providing a substrate structure including a substrate and a metal layer having a recess on the substrate, forming a metal bump on the recess of the metal layer using a ball placement process, and forming a solder paste on the metal bump using a printing process. The manufacturing time is shorter, the manufacturing efficiency is higher, and the manufacturing cost is lower than conventional manufacturing methods.

20 Claims, 5 Drawing Sheets

(52) U.S. Cl.
CPC ........... *H01L 2224/02126* (2013.01); *H01L 2224/031* (2013.01); *H01L 2224/0312* (2013.01); *H01L 2224/0345* (2013.01); *H01L 2224/0361* (2013.01); *H01L 2224/03828* (2013.01); *H01L 2224/0401* (2013.01); *H01L 2224/05018* (2013.01); *H01L 2224/05024* (2013.01); *H01L 2224/05073* (2013.01); *H01L 2224/05147* (2013.01); *H01L 2224/05155* (2013.01); *H01L 2224/05166* (2013.01); *H01L 2224/05547* (2013.01); *H01L 2224/05571* (2013.01); *H01L 2224/05573* (2013.01); *H01L 2224/05582* (2013.01); *H01L 2224/05583* (2013.01); *H01L 2224/05647* (2013.01); *H01L 2224/05655* (2013.01); *H01L 2224/1112* (2013.01); *H01L 2224/1132* (2013.01); *H01L 2224/11318* (2013.01); *H01L 2224/11334* (2013.01); *H01L 2224/11849* (2013.01); *H01L 2224/13005* (2013.01); *H01L 2224/13007* (2013.01); *H01L 2224/13016* (2013.01); *H01L 2224/13021* (2013.01); *H01L 2224/13082* (2013.01); *H01L 2224/13111* (2013.01); *H01L 2224/13139* (2013.01); *H01L 2224/13147* (2013.01); *H01L 2224/13611* (2013.01); *H01L 2224/13639* (2013.01); *H01L 2924/014* (2013.01); *H01L 2924/2064* (2013.01); *H01L 2924/20106* (2013.01); *H01L 2924/20641* (2013.01)

(56) References Cited

U.S. PATENT DOCUMENTS

| | | | | |
|---|---|---|---|---|
| 2005/0082685 | A1* | 4/2005 | Bojkov | H01L 24/05 257/780 |
| 2009/0256256 | A1* | 10/2009 | Meyer | H01L 24/13 257/738 |
| 2011/0101527 | A1* | 5/2011 | Cheng | H01L 24/11 257/738 |
| 2015/0325544 | A1* | 11/2015 | Wang | H01L 24/03 257/738 |
| 2017/0358557 | A1* | 12/2017 | Chen | H01L 25/50 |

OTHER PUBLICATIONS

Li, L., and P. Thompson. "Stencil Printing Process Development for Flip Chip Interconnect", IEEE Transactions on Electronics Packaging Manufacturing, vol. 23, No. 3, 2000, pp. 165-170., doi:10.1109/6104.873243.*

Chen, C. H., et. al., "Development of Micro-Ball Placement Technology for WLCSP" 2011 6th International Microsystems, Packaging, Assembly and Circuits Technology Conference (IMPACT), 2011, doi:10.1109/impact.2011.6117234.*

Johnson, A., et. al., "Stencil Printing Basics Equipment, Material and Process Considerations", Cookson Electronics, 2003.*

Andrew Strandjord, Thorsten Teutsch, Thomas Oppert, Ghassem Azdasht "Wafer-Level Solder Sphere Placement and its Implications" Global SMT & Packaging Magazine—Celebrating 10 Years-, Jul. 2010, p. 14-25.*

* cited by examiner

COPPER PILLAR BUMP STRUCTURE AND MANUFACTURING METHOD THEREFOR

CROSS-REFERENCES TO RELATED APPLICATIONS

The present application claims priority to Chinese patent application No. 201710118714.6, filed with the State Intellectual Property Office of People's Republic of China on Mar. 2, 2017, the content of which is incorporated herein by reference in its entirety.

FIELD OF THE DISCLOSURE

The present disclosure relates to semiconductor technology, and more particularly to a metal bump device and method for manufacturing the same.

BACKGROUND OF THE INVENTION

Conventional semiconductor packaging processes require copper pillar bumps be fabricated on a wafer. At present, copper pillar bumps are mainly fabricated using a chemical plating process. However, the chemical plating process takes a long time (e.g., 60 to 70 minutes) to complete the process, and the chemical plating process requires relatively expensive equipment. The chemical plating process results in low efficiency and high production costs.

BRIEF SUMMARY OF THE INVENTION

The present inventors have discovered the above-described problems and provide a novel technical solution for solving the problems.

According to embodiments of the present disclosure, a method for manufacturing a metal bump device may include providing a substrate structure including a substrate and a metal layer having a recess on the substrate, forming a metal bump on the recess of the metal layer using a ball placement process, and forming a solder paste on the metal bump using a printing process.

In one embodiment, the method may further include performing a reflow process on the solder paste.

In one embodiment, ball placement process includes forming a stencil having a first opening aligned with the recess on the metal layer, forming a flux in the recess through the first opening, bonding the metal bump to the recess through the first opening using the flux, and removing the stencil.

In one embodiment, the first opening has a size that is in the range between 70% and 90% of a size of the recess.

In one embodiment, the printing process includes forming a printing screen having a second opening aligned with the metal bump on the metal bump, forming the solder paste on the metal bump through the second opening, and removing the printing screen.

In one embodiment, the metal bump includes copper, and the solder paste includes tin or tin-silver.

In one embodiment, the metal bump has a diameter in a range between 60 µm and 100 µm, and a length in a range between 60 µm and 150 µm.

In one embodiment, providing the substrate structure includes providing the substrate, forming a liner layer on the substrate, forming an insulator on the liner layer leaving a surface portion of the liner layer uncovered, forming a passivation on the insulator layer, the passivation layer having an opening exposing the uncovered surface portion of the liner layer and a protrusion at a peripheral edge of the opening, the protrusion and the exposed second portion of the liner layer forming a trench, and forming the metal layer on the passivation layer and on the liner layer, the metal layer having a first portion disposed in the trench and a second portion disposed outside the trench. In one embodiment, the method further includes removing the first portion of the metal layer disposed outside the trench.

In one embodiment, the metal layer includes a first metal layer on the substrate and a second metal layer on the first metal layer, and the metal bump is formed on the second metal layer.

Embodiments of the present disclosure also provide a metal bump device that includes a substrate, a metal layer having a recess on the substrate, a metal bump on the recess of the metal layer, and a solder paste on the metal bump.

In one embodiment, the metal bump device further includes a flux configured to bond the metal bump with the metal layer.

In one embodiment, the metal bump has a diameter or width smaller than a width of the recess. In one embodiment, the metal bump has a diameter in a range between 60 µm and 100 µm and a length in a range between 60 µm and 150 µm.

In one embodiment, the metal bump device further includes a liner layer on the substrate, an insulator layer on the liner layer and leaving a surface portion of the liner layer uncovered, and a passivation layer on the insulator layer. The passivation layer has an opening exposing the uncovered surface portion of the liner layer and a protrusion on a peripheral edge of the opening, the protrusion and the exposed surface portion of the liner layer forming a trench, wherein the recess of metal layer is on the trench.

In one embodiment, the metal layer includes a first metal layer on the substrate and a second metal layer on the first metal layer, the metal bump is formed on the second metal layer. In one embodiment, the thicknesses of the first and second metal layers are less than 1 micron.

The following detailed description together with the accompanying drawings will provide a better understanding of the nature and advantages of the present disclosure.

BRIEF DESCRIPTION OF THE DRAWINGS

The accompanying drawings form a part of the present disclosure, that describe exemplary embodiments of the present invention. The drawings together with the specification will explain the principles of the invention.

DETAILED DESCRIPTION OF THE INVENTION

Embodiments of the present disclosure now will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof. Furthermore, as used herein, the words "and/or" may refer to and encompass any possible combinations of one or more of the associated listed items.

Embodiments of the disclosure are described herein with reference to cross-sectional illustrations that are schematic illustrations of idealized embodiments (and intermediate structures) of the disclosure. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

As used herein, the terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process may have been utilized to form regions or junctions in the base semiconductor structure or foundation. In addition, the semiconductor need not be silicon-based, but could be based on silicon-germanium, germanium, or gallium arsenide. The term "substrate" may include any structure having an exposed surface with which to form an integrated circuit. The term "substrate" may also refers to semiconductor structures during processing and may include other layers that have been fabricated thereupon. The terms "wafer" and "substrate" may be used alternatively. The terms "forming" and "depositing" may be used alternatively.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein.

Figure 1:
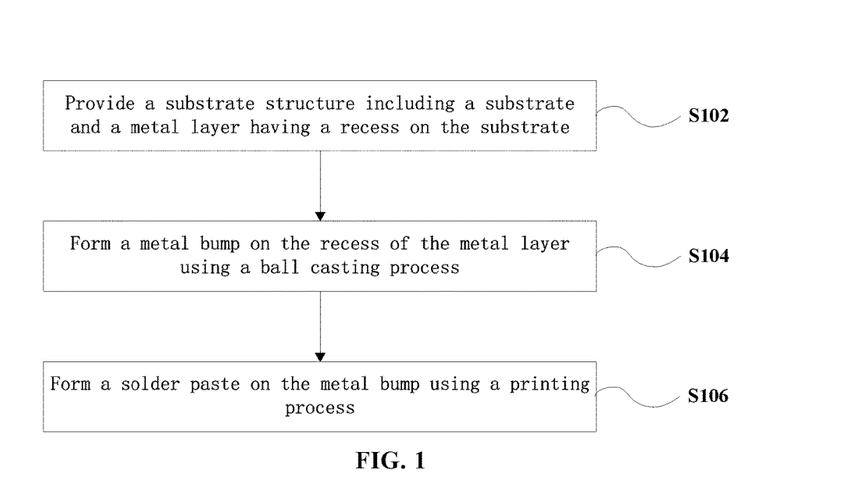
FIG. 1 is a flowchart illustrating a method for manufacturing a metal bump device according to an embodiment of the present disclosure.

FIG. 1 is a flowchart illustrating a method for manufacturing a metal bump device according to an embodiment of the present disclosure. Referring to FIG. 1, the method may include the following steps:

S102: providing a substrate structure. The substrate structure includes a substrate and a metal layer on the substrate. The metal layer includes a recess.

S104: forming a metal bump on the recess using a ball placement process. For example, the metal bump may include copper. The metal bump may have a diameter in the range between 60 µm and 100 µm (e.g., 70 µm, 80 µm, or 90 µm), and a length (height) in the range between 60 µm and 150 µm (e.g., 90 µm, 110 µm, or 140 µm, etc.). The metal bump may have a rectangular shape or a cylindrical shape.

In one embodiment, S104 may include providing a stencil on the metal layer, the stencil includes a first opening aligned with the recess. For example, the size of the first opening may be 70% to 90% of the size of the recess, preferably 80% of the recess size. In one aspect, the first opening is not too large to cause a flux to be excessively overflowed in a subsequent flux formation so that the flux filling different recesses will spill over. On the other hand, the first opening is not too small to ensure that the metal bump can be formed in the recess.

In one embodiment, S104 may further include forming a flux in the recess through the first opening. For example, the flux may be injected into the recess via the opening.

In one embodiment, S104 may further include bonding the metal bump to the recess using the flux through the first opening.

In one embodiment, S104 may also include removing the stencil.

S106: forming a solder paste on the metal bump using a printing process.

In one embodiment, S106 may include providing a printing screen on the metal bump, the printing screen includes a second opening aligned with the metal bump.

In one embodiment, S106 may also include forming a solder paste on the metal bump via the second opening. For example, the solder paste may be coated on the printing screen, and then the portion of the solder paste disposed outside the second opening is scrapped off using a squeegee, such that a solder paste is formed in second opening and on the upper surface of the metal bump. The solder paste may include tin or tin-silver.

In one embodiment, S106 may also include removing the printing screen.

The above-described embodiment provides a method for manufacturing a metal bump device. In the manufacturing method of the present disclosure, a metal bump is formed on a recess of a metal layer using a ball placement process, and a solder paste is formed on the metal bump using a printing process. Compared with conventional chemical plating methods, the method of the present disclosure has a shorter process time and costs less since the method does not require expensive electroplating equipment.

In one embodiment, the method may also include performing a reflow process after forming the solder paste on the metal bump. The reflow process allows the molding of the solder paste (e.g., the solder paste is retracted into a cylindrical shape), and facilitates a chemical reaction between the solder paste and the metal bump, thereby increasing the bonding force between the solder paste and the metal bump. In addition, the reflow process (due to the relatively high temperature) may increase the cohesive force of the flux, so that the metal bump is more firmly bonded to the metal layer.

In one embodiment, the reflow process is performed at a temperature in the range between 240° C. and 250° C., e.g., 245° C.

FIGS. 2 to 11 are cross-sectional views illustrating intermediate stages in the fabrication of a metal bump device according to an embodiment of the present disclosure. A manufacturing method of a metal bump device according to an embodiment of the present disclosure will be described in detail below with reference to FIGS. 2 to 11.

Figure 2:
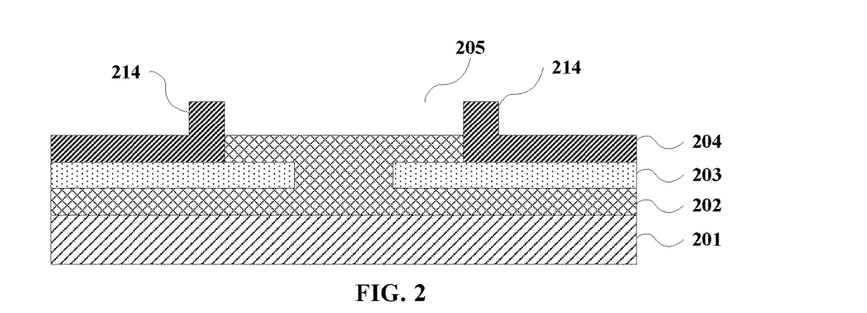
FIGS. 2 to 11 are cross-sectional views illustrating intermediate stages in the fabrication of a metal bump device according to an embodiment of the present disclosure.

Referring to FIG. 2, a substrate structure is provided. In one embodiment, the substrate structure includes a substrate 201. Substrate 201 may be a silicon substrate. The substrate structure also includes a liner layer 202 on substrate 201. Liner layer 202 may include aluminum. The substrate structure also includes an insulator layer 203 on a portion of liner layer 202, i.e., insulator layer 203 does not completely cover liner layer 202 and leaves a surface portion of liner layer 202 uncovered. The insulator layer may include silicon dioxide. The substrate structure also includes a passivation layer (e.g., silicon nitride) 204. Passivation layer 204 has an opening 205 exposing the uncovered surface portion of liner layer 202 and a protrusion 214 on a peripheral edge of opening 205. Protrusion 214 and the exposed surface portion of liner layer 202 form a trench. In one embodiment, after providing the substrate structure shown in FIG. 2, the method also includes performing a pre-cleaning process to the substrate structure to remove debris that may be present on the substrate structure.

Figure 3:
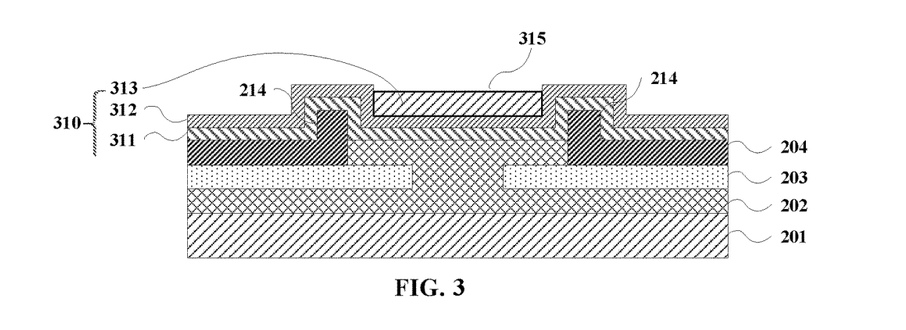

Next, referring to FIG. 3, a metal layer 310 is formed on passivation layer 204 and on the exposed portion of liner layer 202 using a sputtering process, i.e., in the substrate structure, metal layer 310 is formed on passivation 204 and liner layer 202, and the portion of metal layer 310 disposed in the trench form a recess 315. Metal layer 310 may include titanium/copper (Ti/Cu) or titanium/copper/nickel (Ti/Cu/Ni).

In one embodiment, the metal layer may include a first metal layer 311 on substrate 201 (e.g., on passivation layer 204 and liner layer 202), and a second metal layer 312 on first metal layer 311. In one embodiment, the first metal layer may include titanium, and the second metal layer may include copper. In one embodiment, the first metal layer and the second metal layer each may have a thickness of the order of a few tenth of a micron. For example, the thickness of the first metal layer is 0.1 μm, and the thickness of the second metal layer is 0.3 μm.

In another embodiment, the metal layer may further include a third metal layer 313 on the second metal layer. The third metal layer may include copper. The third metal layer has a thickness that is greater than the thickness of the second metal to increase the thickness of the metal layer, thereby increasing the flatness of the recess. For example, the third metal layer has a thickness of about 3 μm to 4 μm. In one embodiment, the process of forming the third metal layer may include forming a patterned mask layer (e.g., a photoresist) on the second metal layer covering a portion of the second metal layer located outside recess 315 and exposing recess 315, and forming a third metal layer on the exposed recess, thereafter the mask layer is removed. Through this process, a third metal layer may be formed on the recess to partially increase the thickness of the metal layer. In the following, description will be made without the third metal layer for the sake of clarity.

Figure 4:
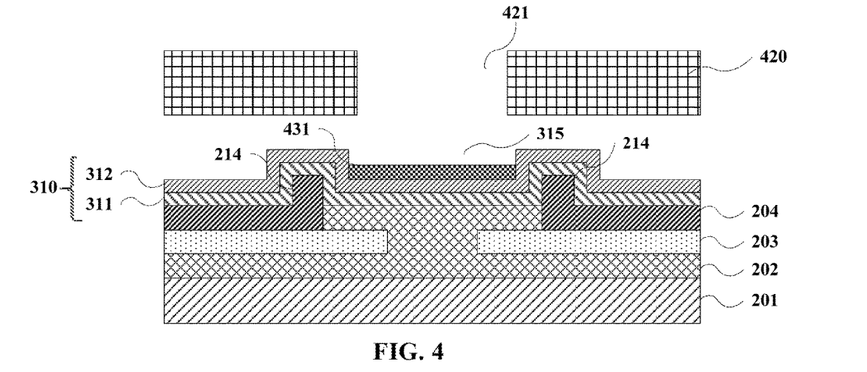

Next, referring to FIG. 4, a stencil 420 is formed on metal layer 310. Stencil 420 has a first opening 421 aligned with recess 315. The size of the first opening is appropriate for the aspect ratio of a metal bump to ensure that the metal bump can be formed vertically in the recess. For example, the size of the first opening may be 70% to 90% of the size of the recess, preferably, the size of the first opening is 80% of the recess size.

Next, referring still to FIG. 4, a flux 431 is formed in recess 315 through first opening 421. In one embodiment, flux 431 may be introduced into recess 315 through first opening 421.

Figure 5:
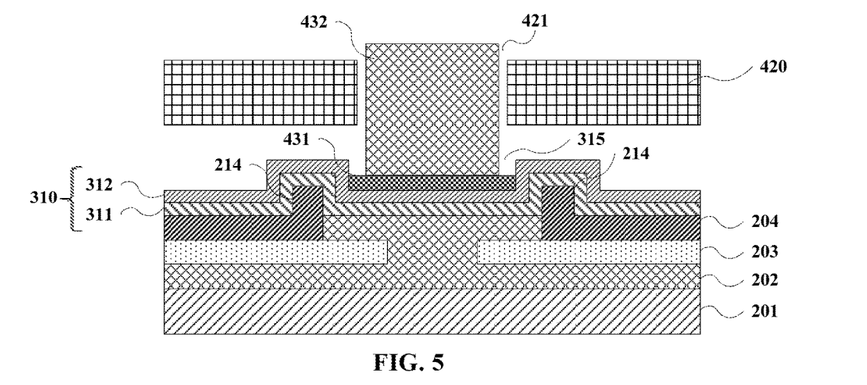

Next, referring to FIG. 5, a metal bump 432 is bonded to recess 315 through first opening 421 using flux 431. That is, metal bump 432 is bonded to metal layer 310 using flux 431. In the embodiment, metal bump 432 is formed on second metal layer 312. In another embodiment, in the case where a third metal layer is formed on the second metal layer, metal bump 432 is formed on the third metal layer. Metal bump 432 may be a copper pillar bump. In one embodiment, metal bump 432 has a diameter or width smaller than the width of recess 315.

Figure 6:
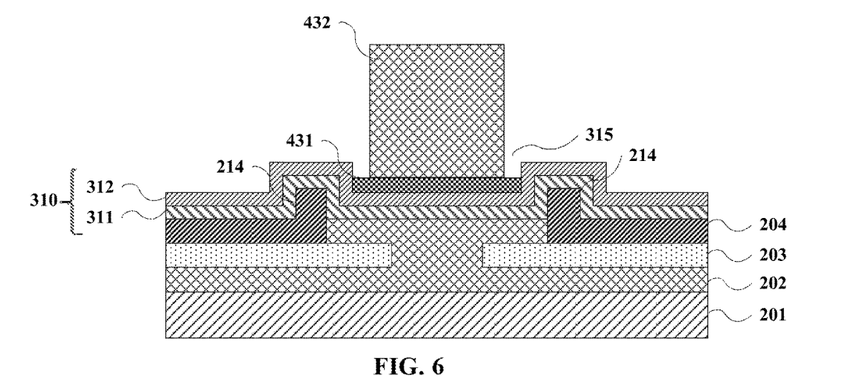

Next, referring to FIG. 6, stencil 420 is removed.

Figure 7:
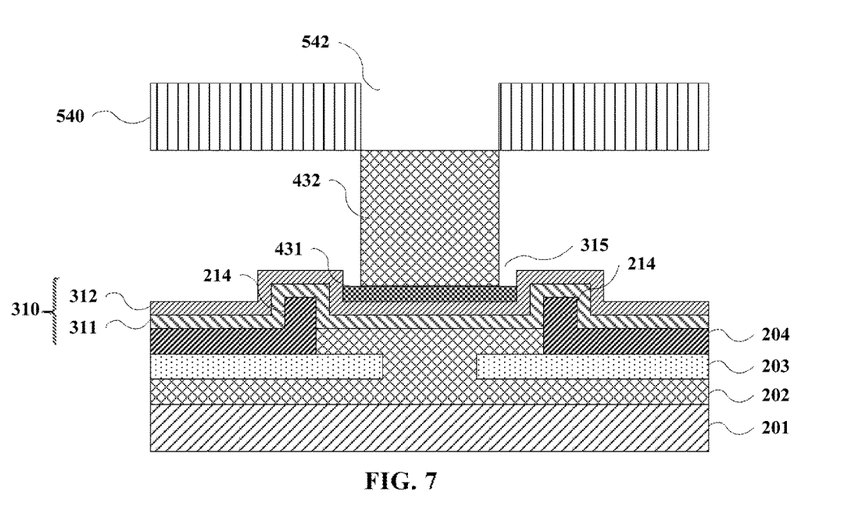

Next, referring to FIG. 7, a printing screen 540 is formed on metal bump 432. Printing screen 540 has a second opening aligned with the metal bump.

Figure 8:
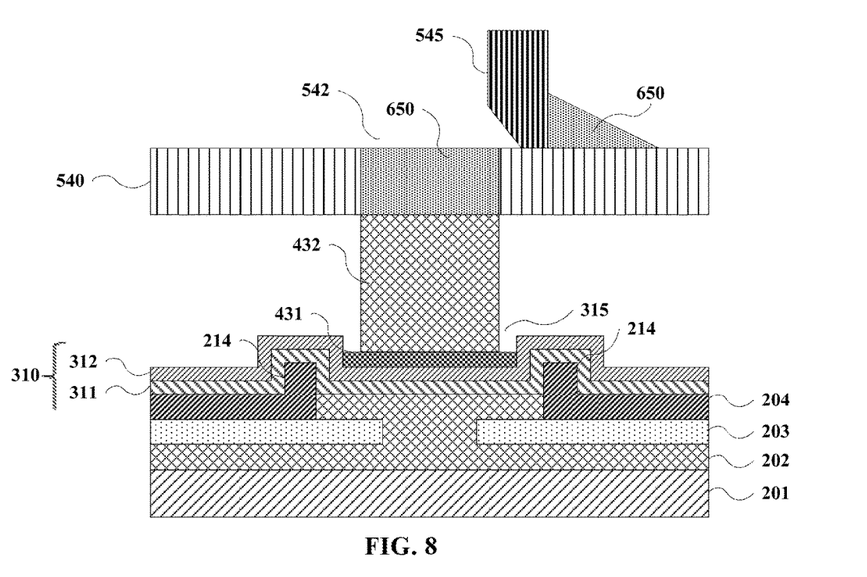

Next, referring to FIG. 8, a solder paste 650 is formed on metal bump 432 through second opening 542 of printing screen 540. As shown in FIG. 8, solder paste 650 is coated on printing screen 540, and a portion of solder paste 650 located outside (external to) the second opening is scrapped off using a squeegee 545 to form solder paste 650 in second opening 545 and on the upper surface of metal bump 432. Solder paste 650 may be a tin solder paste or a tin-silver solder paste.

Figure 9:
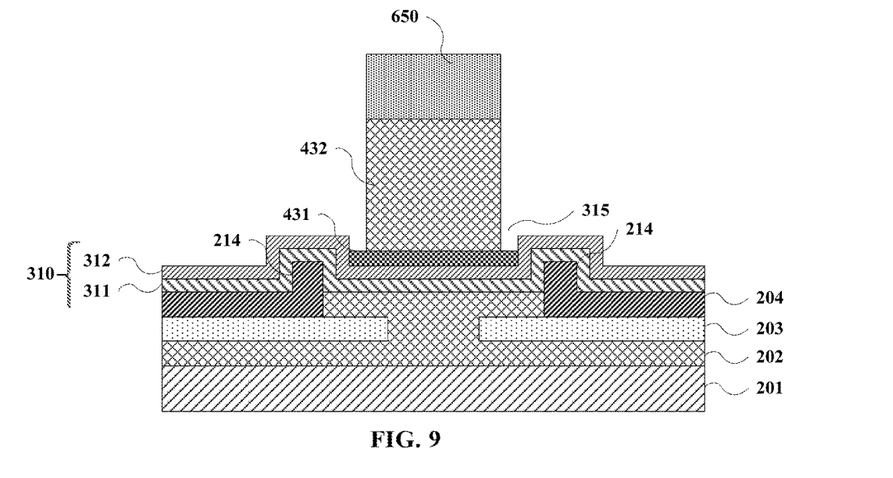

Next, referring to FIG. 9, printing screen 540 is removed.

Figure 10:
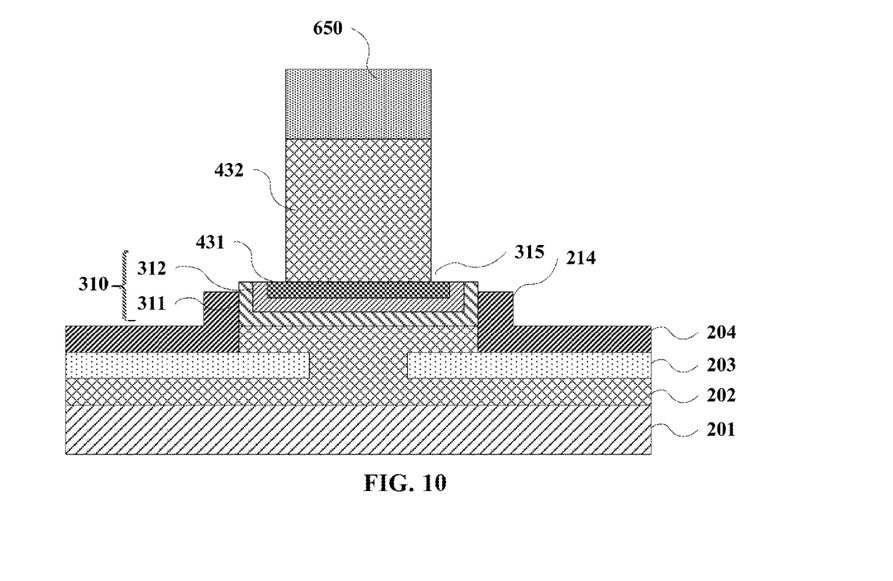

Next, referring to FIG. 10, a portion of metal layer 310 external to the recess is removed using an etching process.

Figure 11:
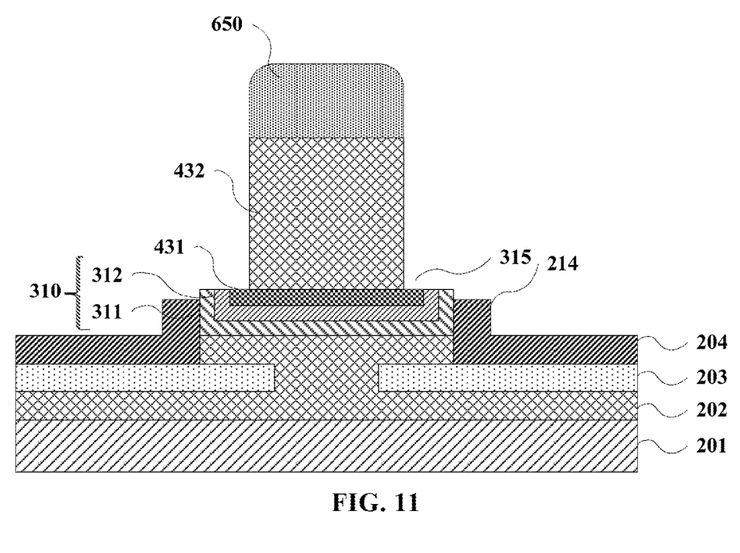

Next, referring to FIG. 11, a reflow process is performed after forming solder paste 650. The reflow process may cause a molding of solder paste 650 (e.g., solder paste 650 is retracted into a cylindrical shape) and a chemical reaction between solder paste 650 and metal bump 432 that increases the bonding force between solder paste 650 and metal bump 432. In addition, the reflow process may also increase the adhesive strength of flux 431 so that metal bump 432 is more firmly attached to metal layer 310.

Embodiments of the present disclosure thus provide a method for manufacturing a metal bump. Compared with conventional chemical plating processes, the above-described method of the present disclosure requires a shorter process time and is thus more efficient and less expensive than conventional chemical plating processes since the manufacturing method does not require expensive electroplating equipment.

Further, after forming the metal bump, the method may also include performing inspections of outgoing quality control (OQC) of the metal bump prior to shipping metal bump devices. For example, inspections may be performed using optical inspection equipment to detect wafer defects, and remove defective devices to deliver good devices for back-end packaging.

Embodiments of the present disclosure also provide a metal bump device. Referring to FIG. 11, the metal bump device may include a substrate 201, and a metal layer 310 on substrate 201. Metal layer 310 includes a recess 315. In one embodiment, metal layer 310 may include a first metal layer on substrate 201 and a second metal layer 312 on first metal layer 311.

Referring to FIG. 11, the metal bump device may also include a metal bump 432 on recess 315. Metal bump 432 is bonded to metal layer 310 through a flux 431. Metal bump 432 may include copper. The metal bump may have a rectangular shape or a cylindrical shape. The metal bump is operable to mechanically support a component or to electrically connect to a component.

In one embodiment, metal bump 432 is on second metal layer 312. In another embodiment, metal layer 310 may include a third metal layer (not shown). In this case, metal bump 432 may be on the third metal layer.

In one embodiment, metal bump 432 has a diameter or width that is less than the width of recess 315 to facilitate an accurate insertion of the metal bump into the recess. This is different from the metal bump that is formed by a chemical plating process in the prior art. In general, the diameter or width of the metal bump fabricated by a chemical plating process is large than the width of the recess.

In one embodiment, the diameter of metal bump 432 may in in the range between 60 µm and 100 µm (e.g., 70 µm, 80 µm, or 90 µm), the length (height) ma be in the range between 60 µm and 150 µm (e.g., 90 µm, 110 µm, or 140 µm).

Referring to FIG. 11, the metal bump device may also include a solder paste 650 on metal bump 432. The solder paste may include tin or tin-silver. Solder paste 650 may have a cylindrical shape or other shapes. The solder paste is configured for bonding the metal bump device with other components.

In one embodiment, referring still to FIG. 11, the metal bump device may also include a liner layer 202 on substrate 201.

In one embodiment, referring still to FIG. 11, the metal bump device may also include an insulator layer 203 on a portion of liner layer 202. Insulator layer 203 does not entirely cover liner layer 202, i.e., a surface portion of liner layer 202 is uncovered.

In one embodiment, referring still to FIG. 11, the metal bump device may also include a passivation layer 204 on insulator layer 203. Passivation layer 204 has an opening that exposes the uncovered surface portion of liner layer 202 and a protrusion 214 on the peripheral edge of the opening. Protrusion 214 and the exposed surface portion of liner layer 202 together form a trench. Metal layer 310 is on the trench and forms recess 315.

The metal bump device of the present disclosure provides many advantages, e.g., its manufacturing process is simpler, the manufacturing process time is shorter, the efficiency is higher, and the manufacturing cost is lower than that of a conventional metal bump device.

The method for manufacturing a metal bump device and the thus formed metal bump device have been described in detail in the above-described embodiments. Details of well-known processes are omitted in order not to obscure the concepts presented herein.

It is to be understood that the above described embodiments are intended to be illustrative and not restrictive. Many embodiments will be apparent to those of skill in the art upon reviewing the above description. The scope of the disclosure should, therefore, be determined not with reference to the above description, but instead should be determined with reference to the appended claims along with their full scope of equivalents.

What is claimed is:

1. A method for manufacturing a metal bump device, the method comprising:
   providing a substrate structure including a substrate and a metal layer having a recess on the substrate;
   forming a metal bump on the recess of the metal layer using a ball placement process; and
   forming a solder paste on the metal bump using a printing process,
   wherein the metal layer comprises a first metal layer on the substrate, a second metal layer on the first metal layer, and a third metal layer on the second metal layer, the third metal layer having a thickness greater than a thickness of the second metal layer.

2. The method of claim 1, further comprising performing a reflow process on the solder paste.

3. The method of claim 1, wherein the ball placement process comprising:
   forming a stencil having a first opening aligned with the recess on the metal layer;
   forming a flux in the recess through the first opening;
   bonding the metal bump to the recess through the first opening using the flux; and
   removing the stencil.

4. The method of claim 3, wherein the first opening has a size that is in a range between 70% and 90% of a size of the recess.

5. The method of claim 1, wherein the printing process comprises:
   forming a printing screen having a second opening aligned with the metal bump on the metal bump;
   forming the solder paste on the metal bump through the second opening; and
   removing the printing screen.

6. The method of claim 1, wherein:
   the metal bump comprises copper;
   the solder paste comprises tin or tin-silver.

7. The method of claim 1, wherein the metal bump has a diameter in a range between 60 µm and 100 µm, and a length in a range between 60 µm and 150 µm.

8. The method of claim 1, wherein providing the substrate structure comprises:
   providing the substrate;
   forming a liner layer on the substrate;
   forming an insulator layer on the liner layer leaving a surface portion of the liner layer uncovered;
   forming a passivation layer on the insulator layer, the passivation layer having an opening exposing an uncovered surface portion of the liner layer and a protrusion at a peripheral edge of the opening, the protrusion and an exposed second portion of the liner layer forming a trench, and forming the metal layer on the passivation layer and on the liner layer, the metal layer having a first portion disposed in the trench and a second portion disposed outside the trench.

9. The method of claim 8, further comprising:
removing the first portion of the metal layer disposed outside the trench.

10. The method of claim 1, wherein the metal bump is formed on the third metal layer.

11. A metal bump device, comprising:
a substrate;
a metal layer having a recess on the substrate;
a metal bump on the recess of the metal layer; and
a solder paste on the metal bump,
wherein the metal layer comprises a first metal layer on the substrate, a second metal layer on the first metal layer, and a third metal layer on the second metal layer, the third metal layer having a thickness greater than a thickness of the second metal layer.

12. The metal bump device of claim 11, further comprising:
a flux configured to bond the metal bump with the metal layer.

13. The metal bump device of claim 11, wherein:
the metal bump comprises copper;
the solder paste comprises tin or tin-silver.

14. The metal bump device of claim 11, wherein the metal bump has a diameter or width smaller than a width of the recess.

15. The metal bump device of claim 11, wherein the metal bump has a diameter in a range between 60 μm and 100 μm and a length in a range between 60 μm and 150 μm.

16. The metal bump device of claim 11, further comprising:
a liner layer on the substrate;
an insulator layer on the liner layer and leaving a surface portion of the liner layer uncovered;
a passivation layer on the insulator layer, the passivation layer having an opening exposing an uncovered surface portion of the liner layer and a protrusion on a peripheral edge of the opening, the protrusion and an exposed surface portion of the liner layer forming a trench,
wherein the recess of the metal layer is on the trench.

17. The metal bump device of claim 11, wherein the metal layer comprises a first metal layer on the substrate and a second metal layer on the first metal layer, the metal bump is formed on the second metal layer.

18. The metal bump device of claim 11, wherein the thickness of the second metal layer is less than 1 micron, and the thickness of the third metal layer is greater than 1 micron.

19. The metal bump device of claim 11, wherein the metal bump is a copper pillar bump forming on the third metal layer.

20. The metal bump device of claim 11, wherein the first metal layer comprises titanium, the second metal layer comprises copper, and the third metal layer comprises copper.

* * * * *